United States Patent [19]
De Vrieze et al.

[11] Patent Number: 5,960,021
[45] Date of Patent: Sep. 28, 1999

[54] SEMICONDUCTOR DIODE LASER AND METHOD OF MANUFACTURING SAME

[75] Inventors: Henricus M. De Vrieze; Leonardus J. M. Hendrix, both of Eindhoven, Netherlands

[73] Assignee: Uniphase Opto Holdings, Inc., San Jose, Calif.

[21] Appl. No.: 08/713,309

[22] Filed: Sep. 13, 1996

[30] Foreign Application Priority Data

Sep. 14, 1995 [EP] European Pat. Off. .............. 95202492

[51] Int. Cl.$^6$ ............................................ H01S 3/19
[52] U.S. Cl. ................................................ 372/49
[58] Field of Search ................................ 372/49, 29, 32, 372/45, 46

[56] References Cited

U.S. PATENT DOCUMENTS

| | | | |
|---|---|---|---|
| 4,092,659 | 5/1978 | Ettenberg | 372/49 |
| 4,815,089 | 3/1989 | Miyauchi et al. | 372/49 |
| 4,852,112 | 7/1989 | Kagawa et al. | 372/49 |
| 4,951,291 | 8/1990 | Miyauchi et al. | 372/49 |

FOREIGN PATENT DOCUMENTS

| | | |
|---|---|---|
| 56-74985 | 6/1981 | Japan . |
| 60-130187 | 7/1985 | Japan . |
| 1-42880 | 2/1989 | Japan . |
| 3-259585 | 11/1991 | Japan . |

OTHER PUBLICATIONS

"Reliable high–power (40 mW) operation of transverse-–mode stabilised InGaAlP laser diodes with strained active layer" by K. Nitta et al, published in Electron. Lett. vol. 28, No. 11, May 21, 1992, pp. 1069–1070.

"Further studies of the role of the electric field strength in laser damage of dielectric layers" by J.H. Apfel in Laser induced damage in optical materials: 1979, Boulde, CO, USA, Oct. 30, 1979, pp. 251–254.

"Computer aided techniques for the design of multilayer filters" by H. Liddell, Adam Hilger Ltd, Bristol, 1981, pp. 25–28.

*Primary Examiner*—Rodney Bovernick
*Assistant Examiner*—Quyen Phan Leung
*Attorney, Agent, or Firm*—Michael A. Glenn

[57] ABSTRACT

A diode laser present in an gas or vacuum atmosphere. The semiconductor body of the diode laser comprises two end faces which bound the resonant cavity within which radiation is generated in an active region. The active region forms part of an active layer situated between two cladding layers on a substrate. At least one end face is coated with a covering layer. The covering layer comprises at least two sub-layers of a first dielectricum with a first refractive index and of a second dielectricum with a second refractive index, respectively, and the optical thicknesses and refractive indices of the sub-layers are chosen such that the maximum intensity of the field strength of the generated radiation in the semiconductor body and the covering layer lies outside the end face, and preferably such that the intensity of the field strength of the generated radiation is approximately a minimum adjacent the end face. Preferably, the covering layer comprises two or three sub-layers of dielectric materials such as $Al_2O_3$, $Si_3N_4$, and $SiO_2$, on an exit face. A very thin intermediate layer of Si or Al is preferably present between the semiconductor body and the covering layer. The invention also relates to a method of manufacturing such a diode laser.

27 Claims, 3 Drawing Sheets

SEMICONDUCTOR DIODE LASER AND METHOD OF MANUFACTURING SAME

BACKGROUND OF THE INVENTION

The invention relates to a semiconductor diode laser—often called diode laser for short hereinafter—surrounded by a medium having a refractive index approximately equal to one, with a semiconductor body comprising a semiconductor layer structure situated on a semiconductor substrate, which structure comprises at least one active layer situated between two cladding layers and a pn junction which, given a sufficient current strength in the forward direction, is capable of generating coherent electromagnetic radiation in a strip-shaped active region situated within a resonant cavity and forming part of the active layer, which resonant cavity is bounded by end faces which are substantially perpendicular to the active region and of which at least one is provided with a covering layer. The invention relates in particular to a diode laser which emits in the sub-micron part of the spectrum. Such a diode laser is particularly suitable for use in the read and/or write head of information-processing systems such as laser printers, bar code readers, and read and/or write devices for optical registration such as CD(Audio) and CDROM (Data) discs. The invention also relates to a method of manufacturing such a laser.

Such a diode laser is known from the publication "Reliable high-power (40 mW) operation of transverse-mode stabilised InGaAlP laser diodes with strained active layer" by K. Nitta et al., published in Electron. Lett. vol. 28, no. 11, 21th May 1992, pp. 1069–1070. The diode laser described therein emits radiation with a wavelength of 698 nm from an active region which forms part of an active layer situated between an n-type cladding layer and a p-type cladding layer. The active region lies within a resonant cavity which is bounded in longitudinal direction by two end faces which are practically perpendicular to the active region and of which one is provided with a covering layer of $Al_2O_3$. Such a layer passivates the end face which acts as an exit face, while the thickness of the covering layer is chosen such that the layer has a desired reflection, i.e. a comparatively low reflection of 10%. The other end face bounding the resonant cavity is provided with a covering layer of high reflection and comprises a dielectricum-Semiconductor, i.c. an $Al_2O_3$—Si multilayer. The medium in which the diode laser is present often comprises a (inert) gas atmosphere, but it may alternatively be vacuum. As the publication shows, the known diode laser combines a high emitted optical power with a long life.

A disadvantage of the known diode laser that it is not satisfactorily in practice in certain cases because an even higher emitted optical power and an even longer life are desired. This is especially the case in the application mentioned above as a write head in an optical registration system.

SUMMARY OF THE INVENTION

It is an object of the invention, accordingly, to provide a diode laser which combines a very high optical power with a very long life. In addition, the manufacture of such a diode laser should be simple.

A diode laser of the kind mentioned in the opening paragraph is for this purpose characterized in that the covering layer comprises at least two sub-layers of a first dielectricum having a first refractive index and a second dielectricum having a second refractive index, the optical thicknesses and refractive indices of the sub-layers being chosen such that the maximum intensity of the field strength of the generated electromagnetic radiation in the semiconductor body and the covering layer lies outside the end face. The invention is based on the recognition that the degradation of the diode laser at an end face does not have a minimum value yet in spite of the passivating action of the known antireflection covering layer. A high end face degradation is promoted by a high intensity of the field strength of the generated radiation in and adjacent the end face. When the covering layer is built up from at least two, a dielectricum containing, sub-layers and suitable refractive indices and suitable optical thicknesses are chosen for these sub-layers, it is achieved that the intensity of the field strength of the radiation in and adjacent the end face is reduced, so that the degradation is reduced. The invention is further based on the recognition that a part of life-time limiting degradation is caused by the fact that a covering layer comprising a semiconductor results in some absorbtion of the electromagnetic radiation. For that reason the optically active main part of the covering layer merely comprises dielectric materials which do not absorb electromagnetic radiation of the wavelengths considered. As a result, the diode laser according to the invention has the desired property that its life is very long also when a very high optical power is supplied.

It is noted that the possibility of reducing the field strength of electromagnetic radiation locally in a multilayer dielectric is known from "Further studies of the role of the electric field strength in laser damage of dielectric layers" by J. H. Apfel in Laser induced damage in optical materials: 1979, Boulder, Colo., U.S.A., Oct. 30, 1979, pp. 251–254. However, this relates to a multilayer coating present on a glass substrate, i.e. not directly on an optically active medium. The laser radiation by which the covering layer is damaged originates from a gas laser emitting in the infrared, not from a diode laser. The problem with which said publication deals is a destructive damage to (part of) the covering layer itself and not a degradation originating from the boundary between a covering layer and an optically active medium and affecting the latter. This is illustrated by the maximum intensity of the electromagnetic radiation mentioned in Apfel's publication, which is approximately 50 $GW/cm^2$. This is approximately a factor $10^4$ more than the maximum intensity of the radiation in a diode laser according to the invention.

In a preferred embodiment of a diode laser according to the invention, the refractive indices and the optical thicknesses of the sub-layers are chosen such that the intensity of the electric field of the generated electromagnetic radiation is approximately a minimum at the area of the end face. Such a diode laser has substantially optimum properties as regards the radiated power and product life. The intensity gradient of the field strength in the active region and the covering (multi-)layer may be calculated as set out in Chapter 1.9 "Calculation of field intensities inside a multilayer" from "Computer aided techniques for the design of multilayer filters" by H. Liddell, Adam Hilger Ltd, Bristol, 1981, pp. 25–28. Such a calculation may serve to ascertain when the intensity of the field strength of the radiation at or adjacent the interface between the active region and the covering layer is reduced or a minimum.

In a major modification of a diode laser according to the invention, the second dielectricum has a higher refractive index than the first dielectricum, and the optical thicknesses of the two sub-layers are chosen such that the sum thereof is approximately equal to $(n*1/2+1/4)*\lambda$, where $\lambda$ is the wavelength of the generated radiation and n a natural number, and preferably such that the optical thickness of the first sub-layer is equal to $n*\lambda/2$ and the optical thickness of the second sub-layer equal to $\lambda/4$. The intensity of the field strength of the radiation is a minimum at or adjacent the end face in such a diode laser, which is an optimum for said degradation. A covering layer which comprises no more than two dielectricum containing sub-layers can be manufactured comparatively easily and reproducibly. In addition, such a covering layer affords a sufficient freedom for adjusting a desired reflection. Preferably, the first material comprises $Al_2O_3$ and the second material $Si_3N_4$. Such dielectrics have the important advantage that they do not absorb the generated radiation. They also have suitable refractive indices, for example, 1.66 and 2.01, respectively, for radiation with a wavelength of approximately 670 nm, and are easy to apply.

In another major modification of a diode laser according to the invention, the second dielectricum has a lower refractive index than the first dielectricum, and the covering layer comprises a third sub-layer of a third dielectricum having a third refractive index which is greater than the second refractive index, while the optical thicknesses of the sub-layers are chosen such that the sum thereof is approximately equal to $(n*1/2+1/4)*\lambda$, where $\lambda$ is the wavelength of the generated radiation and n is a natural number, and preferably such that the sum of the optical thicknesses of the first and second sub-layers is equal to $n*\lambda/2$ and the optical thickness of the third sub-layer is equal to $\lambda/4$. Particularly favorable results were obtained with this modification. An important advantage is that the desired reflection can be adjusted even better in this modification. Preferably, the first dielectricum comprises $Al_2O_3$, the second dielectricum $SiO_2$ —whose refractive index is 1.47 for 670 nm—and the third dielectricum comprises $Si_3N_4$ in this modification. $SiO_2$ also has the advantages mentioned above for the other two dielectrics.

In a favorable modification of the versions described above, a very thin intermediate layer, preferably 2 to 3 nm thick, of Si or Al, preferably of Al, is present between the semiconductor body and the covering layer. This intermediate layer, which probably acts as a getter for oxygen or oxygen compounds at the outside of the semiconductor body, yields surprisingly good results in a diode laser according to the invention. A disadvantage of such an intermediate layer is that it usually absorbs part of the generated radiation, which is undesirable. In a diode laser according to the invention, in which the intensity of the radiation is as low as possible adjacent the intermediate layer, the absorption therein is as low as possible, so that the expected advantage is a maximum. Indeed, the most favorable results as regards product life and power were obtained with this modification.

A diode laser according to the invention is preferably so constructed that the emission wavelength lies below 1 $\mu$m and more preferably below 0.68 $\mu$m. This is the case, for example, when the diode laser is manufactured in the InGaP/InAlGaP or GaAs/AlGaAs material system. A diode laser with an emission wavelength above approximately 1 $\mu$m is found to be less sensitive to (mirror) degradation in practice, and a reduction of the intensity of the field strength at the interface between the diode laser and a covering layer—which is often even not necessary at all—will yield a lesser advantage.

The advantage for the optical power and life of a diode laser according to the invention is greatest for the end face which acts as the exit face. This is because the reflection chosen for the covering layer here is usually comparatively low, for example, between 0 and 30%. This implies that a comparatively high intensity of the field strength of the radiation prevails at or adjacent such an end face. The other end face, not acting as an exit face, usually has a higher reflection, for example between 50 and 100%, and accordingly the intensity of the field strength is comparatively low here. However, a covering layer in which the intensity of the field strength is reduced or minimal adjacent the end face and which merely exclusive contains dielectrics still yields an advantage for product life also in that situation. The covering layer here comprises besides the two sub-layers of the modification described above a number of further sub-layers, for example eight, alternating between a third dielectricum having a third refractive index smaller than the first refractive index and the second dielectricum, and each having an optical thickness of approximately $1/4*\lambda$. $SiO_2$ is a highly suitable third dielectricum also in this situation. The reflection of such a covering layer is approximately 80%. The starting current of a diode laser according to the invention can be comparatively low thanks to the presence of such a strongly reflecting covering layer, which is highly desirable, also for product life.

A method of manufacturing a semiconductor diode laser whereby a semiconductor body is formed through the application on a semiconductor substrate of a semiconductor layer structure with at least one active layer situated between two cladding layers, and whereby a pn junction is formed therein which, given a sufficient current strength in the forward direction, is capable of generating coherent electromagnetic radiation in a strip-shaped active region situated within a resonant cavity and forming part of the active layer, which resonant cavity is bounded by two end faces practically perpendicular to the active layer of which at least one is provided with a covering layer, is characterized according to the invention in that the covering layer is formed through the application of at least two sub-layers of a first dielectricum with a first refractive index and of a second dielectricum with a second refractive index, and the optical thicknesses and refractive indices of the sub-layers are chosen such that the maximum intensity of the generated electromagnetic radiation in the semiconductor body and the covering layer lies outside the end face, and preferably such that the intensity of the field strength is approximately a minimum adjacent the end face. A diode laser according to the invention is obtained in a simple manner by such a method.

BRIEF DESCRIPTION OF THE DRAWINGS

The invention will now be explained in more detail with reference to an embodiment and the accompanying drawing, in which.

The Figures are diagrammatic and not drawn true to scale, the dimensions in the thickness direction being particularly exaggerated for greater clarity. Semiconductor regions of the same conductivity type have been hatched in the same direction as a rule.

DETAILED DESCRIPTION OF THE PREFERRED EMBODIMENTS

Figure 1:
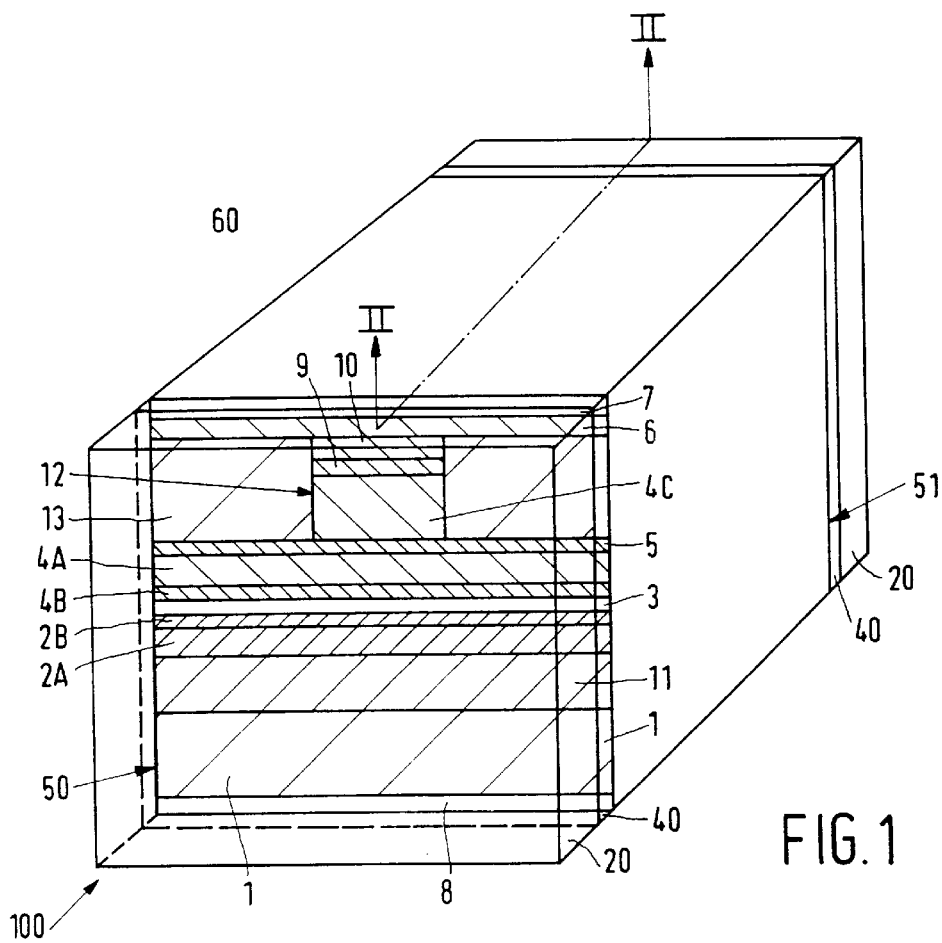
FIG. 1 shows an embodiment of a diode laser according to the invention partly in perspective view, partly in cross-section.
Figure 2:
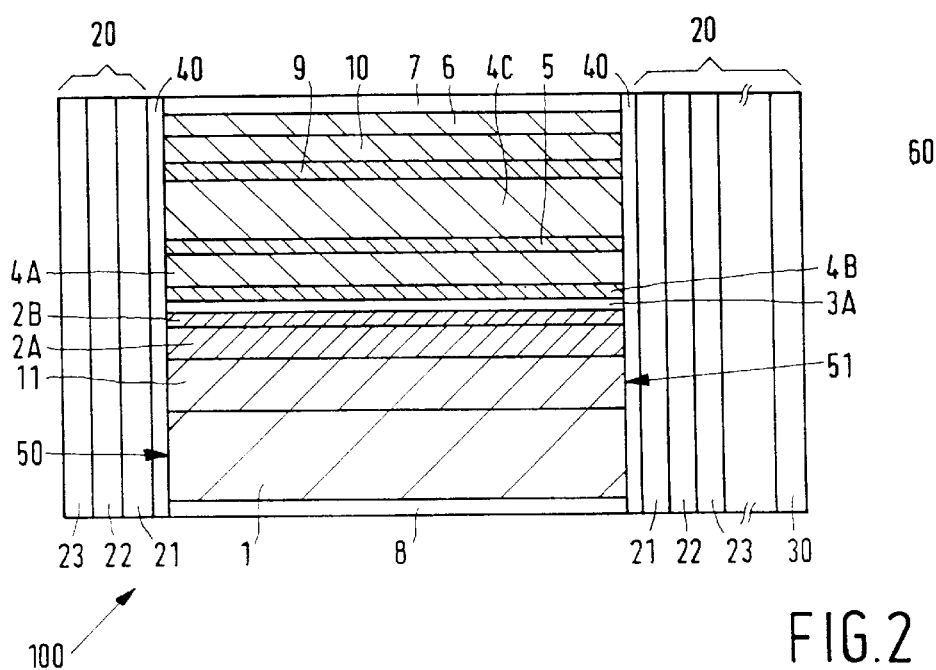
FIG. 2 diagrammatically shows the diode laser of FIG. 1 in a cross-section taken on the line II—II.

FIG. 1 diagrammatically shows an embodiment of a diode laser according to the invention partly in perspective view and partly in cross-section. A diagrammatic cross-section of the diode laser of FIG. 1 taken on the line II—II is depicted in FIG. 2. The diode laser comprises a semiconductor body 100 with an n-type semiconductor substrate 1 of GaAs and surrounded by a medium 60 with a refractive index approximately equal to one, here a dry nitrogen atmosphere. On the substrate 1 there is a semiconductor layer structure with an active layer 3 made of InGaP situated between two cladding layers 2, 4 made of InGaAlP. Portions 2A, 4A of the cladding layers 2, 4 are doped so that they are of the n- and p-conductivity type, respectively. Other portions 2B, 4B form so-called separate confinement layers. The second cladding layer 4 here comprises a portion 4C which forms a mesa 12 next to which a current-blocking layer 13 of n-type GaAs is present. An active region is formed below the mesa 12 in the active layer 3 during operation, in which region coherent electromagnetic radiation is generated, here with a wavelength of 670 nm, and which region is present in a resonant cavity bounded by two end faces 50, 51 which are practically perpendicular to the active region 3A and of which at least one, in this case two is/are provided with a covering layer 20. The diode laser further comprises an etching stopper layer 5, a transition layer 9, two contact layers 10, 6, and two metal layers 7, 8.

According to the invention, the covering layer 20 (see FIG. 2) comprises at least two sub-layers 21, 22 of a first material with a first refractive index and of a second material with a second refractive index, respectively, and the optical thicknesses and refractive indices are chosen such that the maximum intensity of the field strength of the generated radiation in the semiconductor body 100 and the covering layer 20 lies outside the end face 50, 51. As a result, a degradation starting from the end face 50, 51 in a diode laser according to the invention and propagating in the semiconductor body is suppressed at least to a substantial degree. Indeed, such a degradation is promoted by a comparatively high intensity of the field strength of the generated radiation adjacent such an end face 50, 51. A diode laser according to the invention, in which said intensity is reduced, has a particularly long life as a result, also if it supplies a high optical power. Moreover, as the dielectrics of the covering layer do not absorb the generated electromagnetic radiation, degradation due to absorbtion is essentially avoided. The optical thicknesses and refractive indices are so chosen in this example that said intensity of the field strength adjacent the end face has an at least substantially minimum value. This results in a maximum life at high power for the diode laser in this respect.

In the present example, the covering layer 20 on the end face 50 is a low-reflecting covering layer 20, so that the end face 50 acts as the exit face 50 for the generated radiation, and the second sub-layer 22, here made of $SiO_2$ with a refractive index of 1.47, has a lower refractive index than the first sub-layer, here made of $Al_2O_3$ with a refractive index of 1.66. In addition, the covering layer 20 here comprises a third sub-layer 23 of a dielectricum having a refractive index higher than that of the second sub-layer 22, in this case $Si_3N_4$ with a refractive index of 2.01. The optical thicknesses of the sub-layers 21, 22, 23, which are 100, 106 and 72 nm here, respectively, are chosen such that the sum thereof is approximately equal to $(n*1/2+1/4)*\lambda$, where n is a natural number, in this case 1, and $\lambda$ is the wavelength of the generated radiation, in this example 670 nm. The relative deviations from $\lambda/4$ are −1%, −6%, and −12% for the sub-layers 21, 22, 23, respectively. These deviations from an optical thickness optimized for the intensity of the field strength were chosen so as to give the exit face 50 a reflection of approximately 10% in the present example. In the situation which is an optimum for said intensity, the sum of the optical thicknesses of the first two sub-layers 21, 22 is $n*\lambda/2$, and the optical thickness of the third sub-layer is $\lambda/4$. In such a case, for example, the optical thicknesses of the sub-layers 21, 22, 23 are 101, 113, and 83 nm, respectively. This corresponds to a reflection of approximately 6% at the exit face 50. The refractive index of the third sub-layer 23 must be greater than that of $Si_3N_4$ in order to make the intensity of the field strength adjacent the exit face 50 a minimum also at a reflection of 10%. This can be achieved in that, for example, a non-stoichiometric, silicon nitride is chosen as the third material. A very thin intermediate layer 40 of Al, here approximately 2.5 nm thick, is furthermore present between the covering layer 20 and the end face 50 in this example. Such an intermediate layer 40 in combination with a covering layer 20 which reduces the intensity of the field strength of the radiation is found to contribute considerably to a long life of the diode laser. Said intermediate layer 40, which also absorbs radiation, is allowed to be thicker here than in the case of a covering layer 20 which does not reduce the intensity, and can as a result perform its passivating or oxygen-gettering function better.

Figure 3:
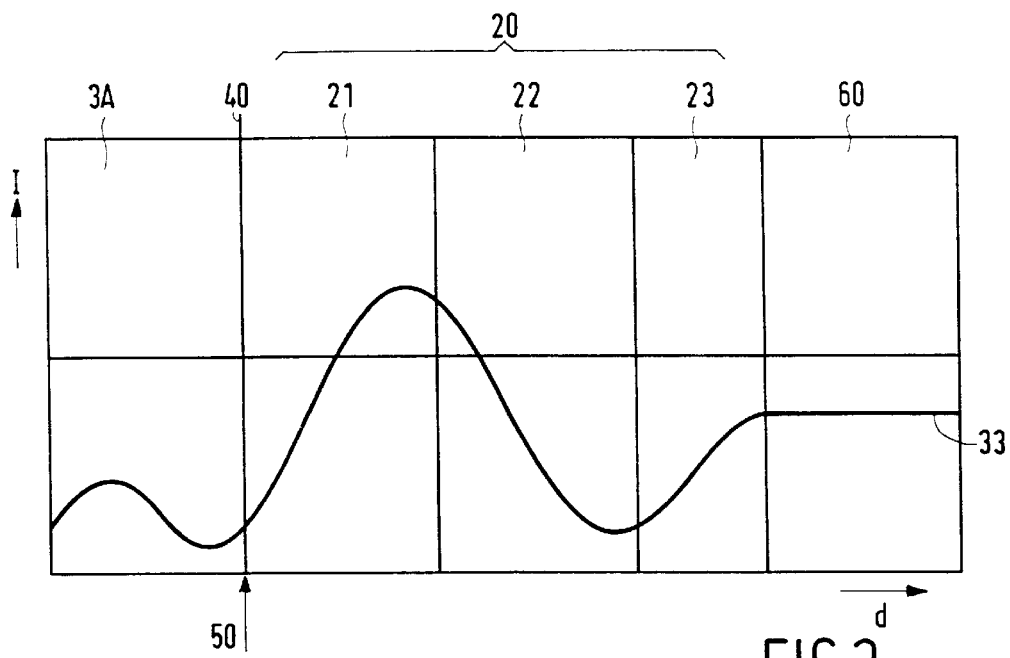
FIG. 3 plots the intensity of the field strength of the radiation generated in the diode laser of FIG. 1 as a function of the distance adjacent the end face which acts as the exit face.

FIG. 3 plots the intensity 33 of the field strength of the radiation generated in the diode laser of the present example as a function of the distance adjacent the exit face 50. Curve 33 clearly shows that the maximum intensity of the field strength lies outside the end face 50 and that the intensity near the end face 50 is at least substantially a minimum in this example. Comparison with a similar graph (not shown) for a diode laser having a conventional, single-layer covering of, for example, $Al_2O_3$ with the same reflection of 10% demonstrates that the intensity of the field strength near the end face 50 is higher by a factor of more than 1.5 in the latter case.

A covering layer 20 for an end face 50 acting as the exit face may very well be composed of only two sub-layers 21, 22. In that case the second sub-layer 22 has a higher refractive index than the first sub-layer 21, and the optical thicknesses of the sub-layers 21, 22 are chosen such that the sum thereof is approximately equal to $(n*1/2+1/4)*\lambda$, and preferably such that the optical thickness of the first sub-layer 21 is equal to $n*\lambda/2$ and the optical thickness of the second sub-layer 22 equal to $\lambda/4$. Such a covering layer 20, however, is also very suitable for acting as a base for an end face 51 not acting as the exit face, as in the present example, see FIG. 2. Such an end face 51 should be provided with a covering layer 20 of high reflection so as to keep the starting current of the diode laser sufficiently low. The end face 51 in the present example has a reflection of approximately 80%. The first sub-layer 21 is made of $Al_2O_3$ for this purpose and has an optical thickness of approximately $\lambda/2$, here 202 nm. The second sub-layer 22 is made of $Si_3N_4$ and has an optical thickness of approximately $\lambda/4$, here 83 nm. The desired high reflection of 80% is realized here by means of additional sub-layers 23, 24, 25, 26, 27, 28, 29, 30, of which only the first 23 and last 30 are shown in FIG. 2. The additional sub-layers 23 . . . 30 each have a thickness of approximately $\lambda/4$ and alternately comprise a dielectricum of lower refractive index than the first sub-layer 21 and a dielectricum of the same refractive index as the second sub-layer 22, here alternately $SiO_2$ and $Si_3N_4$. Although a reduction of the intensity of the field strength adjacent the end face 51 not acting as the exit face is less important for reducing the degradation of the diode laser than adjacent the exit face 50, the covering layer 20 on the end face 51 does contribute thereto, and thus also to an increase in product life. An intermediate layer 40 similar to the one described with reference to the end face 50 above is again present between the end face 51 and the covering layer 20 thereon.

Figure 4:
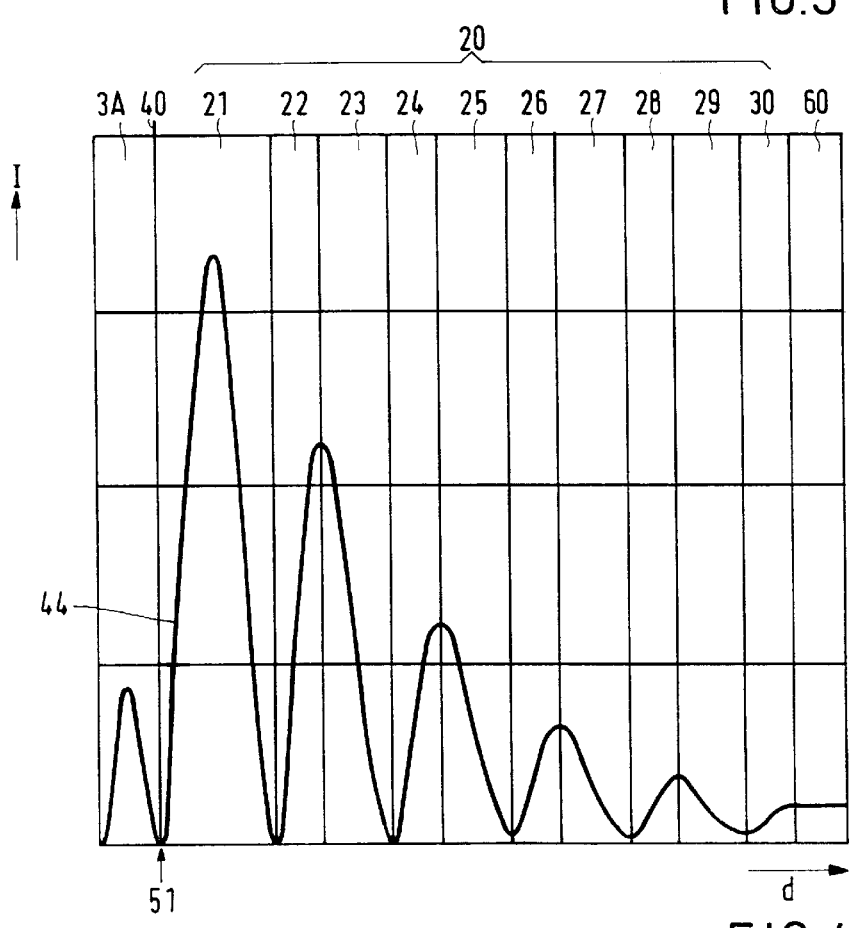
FIG. 4 plots the intensity of the field strength of the radiation generated in the diode laser of FIG. 1 as a function of the distance adjacent the other end face.

FIG. 4 plots the intensity gradient 44 of the field strength of the radiation generated in the present embodiment of the diode laser as a function of the distance adjacent the other end face 51. Curve 44 shows that the intensity of the field strength adjacent the end face 51 with a covering layer 20 as described above is not only a minimum, but even at least substantially equal to zero. This corresponds to a situation which is an optimum for the life of the diode laser.

Figure 5:
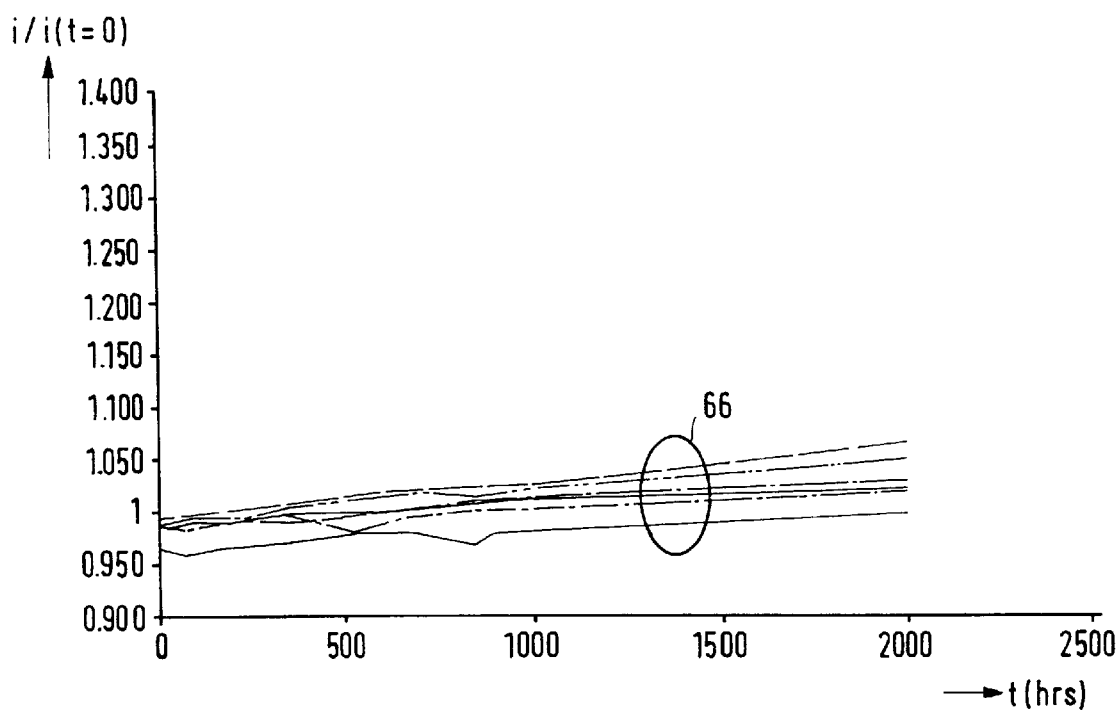
FIG. 5 plots the gradient of the normalized starting current of the diode laser of FIG. 1 as a function of time.
Figure 6:
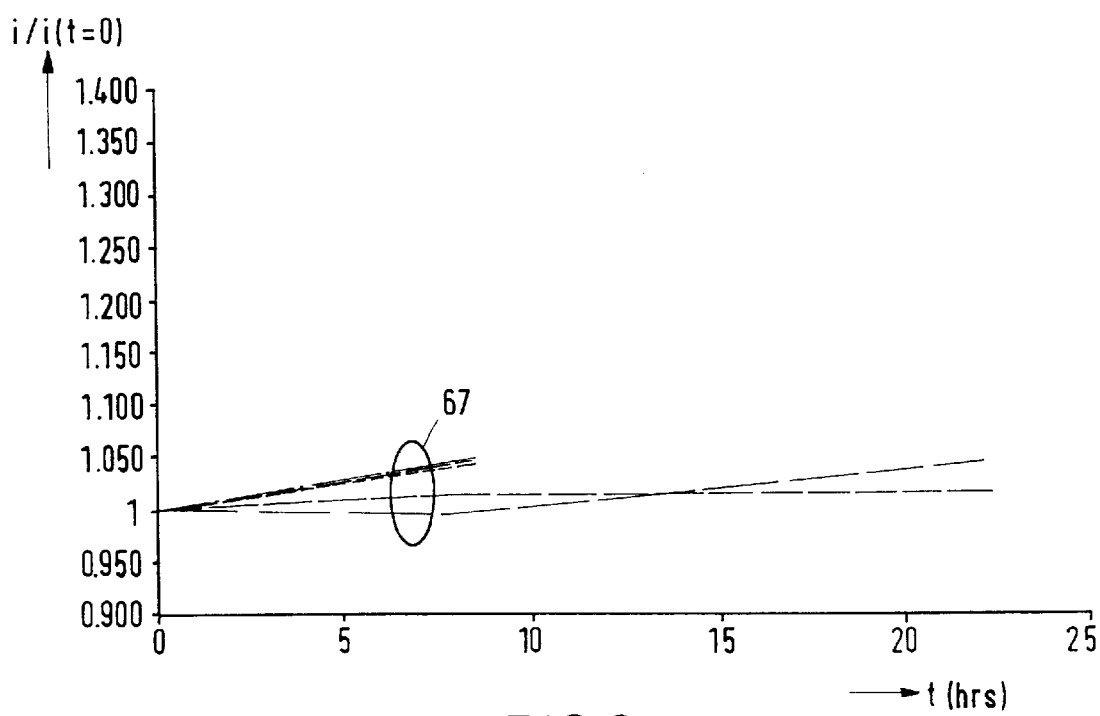
FIG. 6 plots the gradient of the normalized starting current as a function of time for a diode laser comparable to that of FIG. 1, but having a conventional covering layer.

FIG. 5 plots the normalized starting current 66 of six diode lasers according to the present example as a function of time. Curve 67 in FIG. 6 shows the same quantity 67 of six conventional diode lasers for comparison. All diode lasers have identical semiconductor bodies and the same reflections at the end faces, i.e. approximately 10% for the exit face and 80% for the other end face. The emitted optical power is also the same for the two groups of diode lasers 66, 67 and is 50 mW. The diode lasers were tested at a temperature of 50° C. A comparison of curves 66 and 67 shows that the diode lasers according to the invention (curve 66) are highly superior to the conventional diode lasers (curve 67). The extremely long life of at least 2000 hours obtained, measured for a very high optical power and a comparatively high temperature, renders the diode lasers according to the invention highly suitable for applications where a very high optical power and a very long life are desired or necessary.

The diode laser of this example is manufactured as follows by a method according to the invention. The manufacture of the semiconductor body 100 of the diode laser proceeds as described, for example, in PCT patent application filed by Applicant and published under No. WO 96/11503 on Apr. 18, 1996. After the semiconductor body 100 has been manufactured and a conductive layer 7, 8 has been provided on the upper and lower side thereof, strips are cleaved off each containing a row of diode lasers whose side faces form the end faces 50, 51 of the diode lasers. A covering layer 20 is now provided on the side faces of the strips, i.e. on the end faces 50, 51, which covering layer comprises at least two sub-layers 21, 22 of a first dielectricum with a first refractive index and a second dielectricum with a second refractive index, respectively, and the refractive indices and optical thicknesses of the sub-layers 21, 22 are chosen such that the maximum intensity of the field strength of the generated radiation in the semiconductor body 100 and the covering layer 20 lies outside the end faces 50, 51, preferably such that said intensity is substantially a minimum adjacent the end faces 50, 51. The covering layer is constructed as described above. Preferably, the covering layer 20 is provided by means of (magnetron) sputtering. Then individual diode lasers according to the invention and suitable for further final mounting are obtained through repeated cleaving of said strips.

The invention is not limited to the embodiment described, since many modifications and variations are possible to those skilled in the art within the scope of the invention. Thus materials, compositions, and thicknesses may be chosen for the various (semiconductor) layers other than those mentioned in the example. It is also possible to replace the conductivity types all (simultaneously) with their opposites. It is especially noted that the invention may also be advantageously used in diode lasers other than III–V, such as II–VI diode lasers. Alternative structures to those used in the example may also be used, inter alia index-guided structures or a gain-guided structure.

What is claimed is:

1. A semiconductor diode laser surrounded by a medium having a refractive index approximately equal to one, with a semiconductor body comprising a semiconductor layer structure situated on a semiconductor substrate, which structure comprises at least one active layer situated between two cladding layers and a pn junction which, given a sufficient current strength in the forward direction, is capable of generating coherent electromagnetic radiation in a strip-shaped active region situated within a resonant cavity and forming part of the active layer, which resonant cavity is bounded by end faces which are substantially perpendicular to the active region and of which at least one is provided with a covering layer, characterized in that the covering layer comprises at least two sub-layers of a first dielectricum having a first refractive index and a second dielectricum having a second refractive index, respectively, the optical thicknesses and refractive indices of the sub-layers being chosen such that the maximum intensity of the field strength of the generated electromagnetic radiation in the semiconductor body and the covering layer lies outside the end face.

2. A semiconductor diode laser as claimed in claim 1, characterized in that the thicknesses and the refractive indices of the sub-layers are chosen such that the intensity of the field strength of the generated electromagnetic radiation is approximately a minimum at the area of the end face.

3. A semiconductor diode laser as claimed in claim 2, characterized in that the second dielectricum has a higher refractive index than the first dielectricum and the sum of the optical thicknesses of the sub-layers is approximately equal to $(n*1/2+1/4)*\lambda$, where $\lambda$ is the wavelength of the generated radiation and n a natural number.

4. A semiconductor diode laser as claimed in claim 3, characterized in that the first dielectricum comprises $Al_2O_3$ and the second dielectricum comprises $Si_3N_4$.

5. A semiconductor diode laser as claimed in claim 3, characterized in that the end face provided with the covering layer forms an exit face for the generated electromagnetic radiation, of which the wavelength is lower than approximately 1 $\mu$m.

6. A semiconductor diode laser as claimed in claim 5, wherein the wavelength is lower than approximately 0.68 $\mu$m.

7. A semiconductor diode laser as claimed claim 3, characterized in that a very thin intermediate layer, preferably 2 to 3 nm thick, of a material selected from one of Si and Al, is present between the semiconductor body and the covering layer.

8. A semiconductor diode laser as claimed in claim 7, wherein the very thin intermediate layer is Al.

9. A semiconductor diode laser as claimed in claim 3, wherein the optical thickness of the first sub-layer is equal to $n*\lambda/2$ and the optical thickness of the second sub-layer is equal to $\lambda/4$.

10. A semiconductor diode laser as claimed in claim 2, characterized in that the second dielectricum has a lower refractive index than the first dielectricum and the covering layer comprises a third sub-layer of a third dielectricum having a third refractive index which is greater than the second refractive index, while the sum of the optical thicknesses of the sub-layers is approximately equal to $(n*1/2+1/4)*\lambda$, where $\lambda$ is the wavelength of the generated radiation and n is a natural number.

11. A semiconductor diode laser as claimed in claim 5, characterized in that the first dielectricum comprises $Al_2O_3$, the second dielectricum comprises $SiO_2$, and the third material comprises $Si_3N_4$.

12. A semiconductor diode laser as claimed in claim 10, characterized in that the end face provided with the covering layer forms an exit face for the generated electromagnetic radiation, of which the wavelength is lower than approximately 1 µm.

13. A semiconductor diode laser as claimed in claim 12, wherein the wavelength is lower than approximately 0.68 µm.

14. A semiconductor diode laser as claimed claim 10, characterized in that a very thin intermediate layer, preferably 2 to 3 nm thick, of a material selected from one of Si and Al, is present between the semiconductor body and the covering layer.

15. A semiconductor diode laser as claimed in claim 14, wherein the very thin intermediate layer is Al.

16. A semiconductor diode laser as claimed in claim 10, wherein the sum of the optical thicknesses of the first and second sub-layers is equal to $n*\lambda/2$ and the optical thickness of the third sub-layer is equal to $\lambda/4$.

17. A semiconductor diode laser as claimed in claim 2, characterized in that the second dielectricum has a higher refractive index than the first dielectricum and the sum of the optical thicknesses of the sub-layers is approximately equal to $(n*1/2+1/4)*\lambda$, where $\lambda$ is the wavelength of the generated radiation and n a natural number.

18. A semiconductor diode laser as claimed in claim 17, wherein the optical thickness of the first sub-layer is equal to $n*\lambda/2$ and the optical thickness of the second sub-layer is equal to $\lambda/4$.

19. A semiconductor diode laser as claimed in claim 1, characterized in that the end face provided with the covering layer forms an exit face for the generated electromagnetic radiation, of which the wavelength is lower than approximately 1 µm.

20. A semiconductor diode laser as claimed in claim 19, wherein the wavelength is lower than approximately 0.68 µm.

21. A semiconductor diode laser as claimed in claim 1, characterized in that a very thin intermediate layer, preferably 2 to 3 nm thick, of a material selected from one of Si and Al, is present between the semiconductor body and the covering layer.

22. A semiconductor diode laser as claimed in claim 21, wherein the very thin intermediate layer is Al.

23. A semiconductor diode laser as claimed in claim 1, characterized in that the semiconductor diode laser is manufactured in the InGaP/InAlGaP or GaAs/AlGaAs material system.

24. A semiconductor diode laser as claimed in claim 1, characterized in that the first dielectricum comprises $Al_2O_3$ and the second dielectricum comprises $Si_3N_4$.

25. A semiconductor diode laser as claimed in claim 1, characterized in that the second dielectricum has a lower refractive index than the first dielectricum and the covering layer comprises a third sub-layer of a third dielectricum having a third refractive index which is greater than the second refractive index, while the sum of the optical thicknesses of the sub-layers is approximately equal to $(n*1/2+1/4)*\lambda$, where $\lambda$ is the wavelength of the generated radiation and n is a natural number.

26. A semiconductor diode laser as claimed in claim 25, wherein the sum of the optical thicknesses of the first and second sub-layers is equal to $n*\lambda/2$ and the optical thickness of the third sub-layer is equal to $\lambda/4$.

27. A semiconductor diode laser as claimed in claim 1, characterized in that the first dielectricum comprises $Al_2O_3$, the second dielectricum comprises $SiO_2$, and a third sub-layer comprises $Si_3N_4$.

* * * * *